(12) United States Patent
Carney

(10) Patent No.: US 7,356,720 B1
(45) Date of Patent: Apr. 8, 2008

(54) DYNAMIC PROGRAMMABLE DELAY SELECTION CIRCUIT AND METHOD

(75) Inventor: John C. Carney, Bedford, MA (US)

(73) Assignee: Juniper Networks, Inc., Sunnyvale, CA (US)

( * ) Notice: Subject to any disclaimer, the term of this patent is extended or adjusted under 35 U.S.C. 154(b) by 1147 days.

(21) Appl. No.: 10/354,118

(22) Filed: Jan. 30, 2003

(51) Int. Cl.
G06F 1/12 (2006.01)
G06F 1/00 (2006.01)
G06F 3/038 (2006.01)

(52) U.S. Cl. .................. 713/400; 713/500; 345/213
(58) Field of Classification Search ............. 713/500, 713/400; 345/204, 212, 213
See application file for complete search history.

(56) References Cited

U.S. PATENT DOCUMENTS 5,890,100 A * 3/1999 Crayford .................... 702/130
5,943,206 A * 8/1999 Crayford .................... 361/103
6,011,749 A * 1/2000 Roth et al. .................. 365/233
6,160,542 A * 12/2000 Hwang ....................... 345/213
7,164,415 B2 * 1/2007 Ooishi et al. ............... 345/204

OTHER PUBLICATIONS

"Double Data Rate Delay Line," SA14-2394-00, IBM Microelectronics Division, Dec. 10, 1999, 25 pages.
"DDR SDRAM Functionality and Controller Read Data Capture," Micron Technology, Inc. DesignLine vol. 8, Issue 3, 1999, 24 pages

* cited by examiner

*Primary Examiner*—Suresh K Suryawanshi
(74) *Attorney, Agent, or Firm*—Harrity Snyder LLP

(57) ABSTRACT

A controller may include a measurement circuit configured to generate a proxy signal representing delay variations in the controller. The measurement circuit may also generate a measurement value from the proxy signal. A control circuit may be configured to convert the measurement value into a control value. A delay circuit may be adjusted by the control value to alter an amount of delay of a signal.

19 Claims, 9 Drawing Sheets

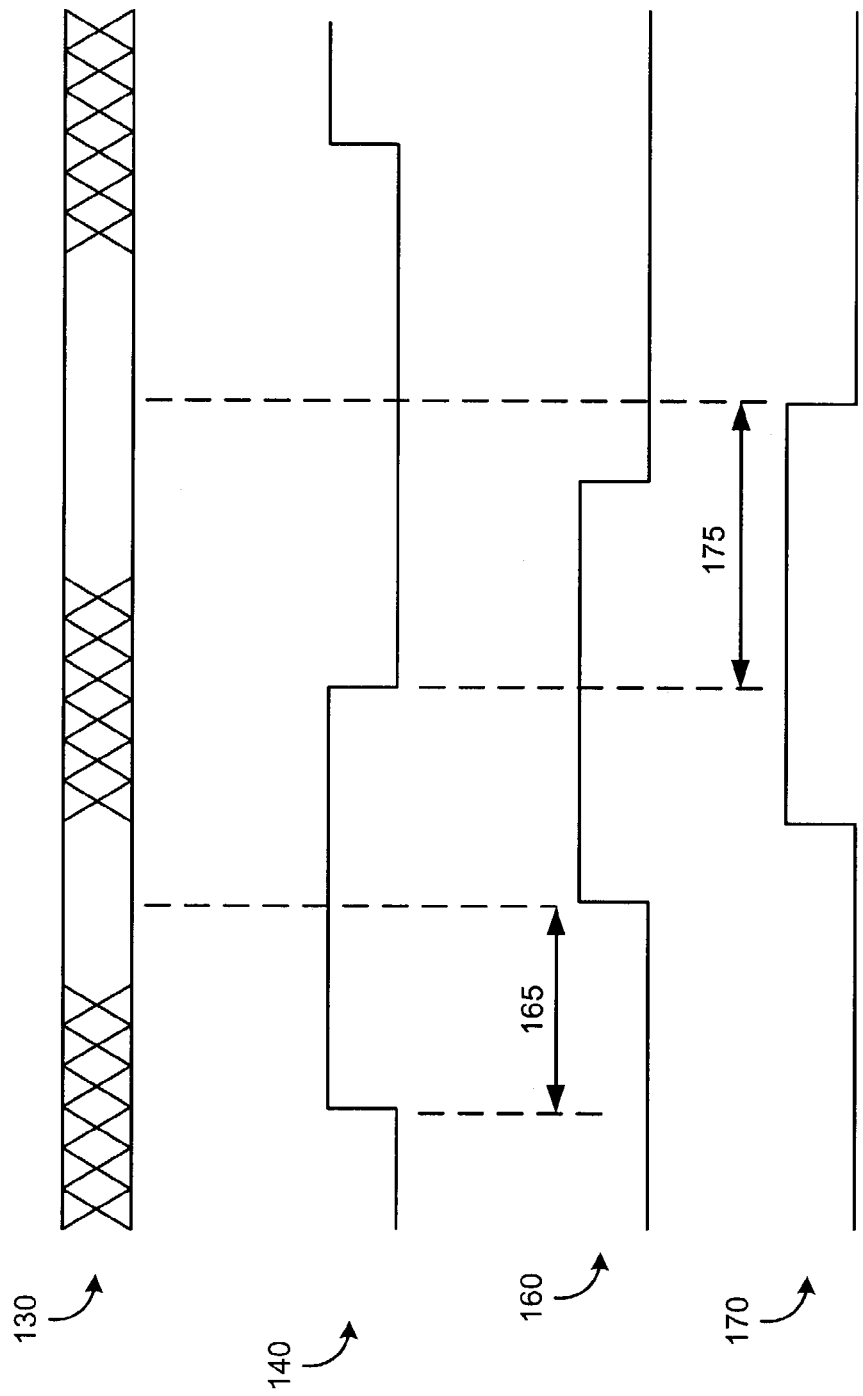

DYNAMIC PROGRAMMABLE DELAY SELECTION CIRCUIT AND METHOD

BACKGROUND OF THE INVENTION

1. Field of the Invention

The present invention relates generally to sensing operating conditions of a device, and more particularly, to controlling one or more device parameters based on the sensed operating conditions.

2. Description of Related Art

In certain devices, it may be desirable to adjust device parameters to achieve desired operation of the device. Often, this adjustment, or control, of the device parameters must be performed in an accurate manner to ensure optimal operation of the device. One example of such accurate control may be in the timing of read and write operations in memory devices.

Double data rate dynamic random access memory (DDR DRAM), for example, typically transfers data based on signals on a bi-directional strobe line. DDR DRAM devices typically work in conjunction with a memory controller. The memory controller may generate fixed delays on the "input" strobe signal from the DDR DRAM in order to read data, and may generate fixed delays on the "output" strobe signal so that the DDR DRAM may capture write data from the controller. It may be desirable for the memory controller to generate different fixed delays (i.e., "asymmetric" delays) for the input strobe signal and the output strobe signal.

One way to generate a fixed delay within a memory controller-type application-specific integrated circuit (ASIC) is to chain a string of logic devices (e.g., buffers or inverters) to create a delay line that may be tapped at various locations along the delay line. The actual delay(s) for a given delay line design may vary, however, due to manufacturing process variations, voltage variations within the ASIC chip, and/or temperature variations within the ASIC chip. Moreover, a change in the selection of a tap along the delay line at an inopportune time may cause a glitch on the bi-directional or internal strobe line. Such a glitch may cause the DDR DRAM or memory controller to capture erroneous data, or it may cause the DDR DRAM or memory controller to enter an erroneous state.

Therefore, there exists a need to generate accurate delays in memory controllers.

SUMMARY OF THE INVENTION

Systems consistent with the principles of the invention address this and other needs by generating delays based on operating conditions of the system. A correspondence between the operating conditions and the an amount of delay adjustment may also be programmed into and stored in the system.

In accordance with one aspect of the invention as embodied and broadly described herein, a system may include a memory configured to generate a timing signal and a delay circuit configured to delay a first portion of the timing signal by a first amount based on a control signal. A measurement circuit may be configured to measure one or more parameters of the system and generate a measurement value. A control circuit may be configured to convert the measurement value into the control signal for the delay circuit.

In another implementation consistent with principles of the invention, a controller may include a measurement circuit configured to generate a proxy signal representing delay variations in the controller. The measurement circuit may also generate a measurement value from the proxy signal. A control circuit may be configured to convert the measurement value into a control value. A delay circuit may be adjusted by the control value to alter an amount of delay of a signal.

In a further implementation consistent with principles of the invention, a method of controlling an actuator circuit in a system may include measuring an operating condition of the system using a proxy that is proportional to the operating condition. The method may also include determining an adjustment value from the measured operating condition. The actuator circuit may be controlled based on the adjustment value.

BRIEF DESCRIPTION OF THE DRAWINGS

The accompanying drawings, which are incorporated in and constitute a part of this specification, illustrate embodiments of the invention and, together with the description, explain the invention. In the drawings.

FIG. 1C is a timing diagram associated with the data line and the strobe line in FIG. 1A during a data read operation;

DETAILED DESCRIPTION

The following detailed description of the invention refers to the accompanying drawings. The same reference numbers may be used in different drawings to identify the same or similar elements. Also, the following detailed description does not limit the invention. Instead, the scope of the invention is defined by the appended claims and equivalents.

Systems and methods consistent with the principles of the invention may generate asymmetric delays based on operating conditions of the system and pre-programmed, nominal delay values. A correspondence between the operating conditions and an amount of delay adjustment may also be programmed into the system.

Exemplary System

Figure 1A:
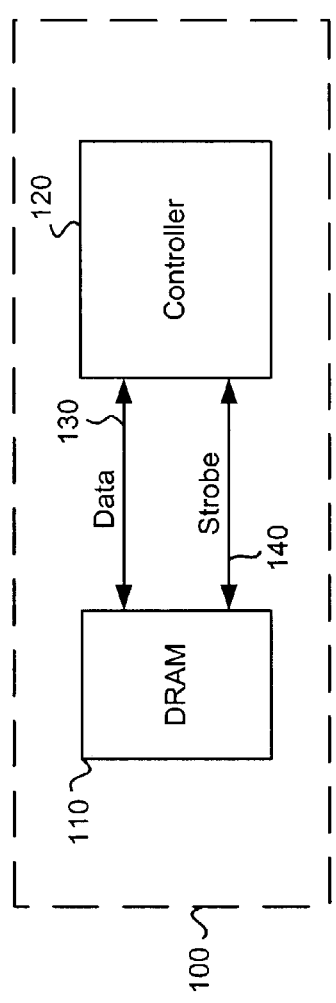
FIG. 1A is a diagram illustrating an exemplary system in which concepts consistent with aspects of the invention may be implemented.

FIG. 1A is a diagram illustrating an exemplary system 100 in which concepts consistent with aspects of the invention may be implemented. In one implementation, system 100 may include a circuit board on which portions of system 100 are located. The circuit board may also house other components (not shown), such as power distribution components, communication components, and processors.

System 100 may include a DDR DRAM 110 and a controller 120. DRAM 110 and controller 120 may be connected by a bi-directional data line 130 and a bi-directional strobe line 140. Although shown as single lines, data line 130 and strobe line 140 may each include a number of traces to accomplish their respective functions. Data line 130, for example, may include eight traces to transfer a byte of data in parallel.

DRAM 110 may generate an external strobe signal corresponding to a data read operation. Data on data line 130 may transition on both the positive and negative transitions of the external strobe signal. Controller 120 may generate internal read strobe signal(s) based on the external strobe signal on strobe line 140 from DRAM 110. This ensures that data is read from DRAM 110 when it is considered valid. Also, controller 120 may generate an internal write strobe signal corresponding to a data write operation. Data on data line 130 may transition on both the positive and negative transitions of the internal write strobe. This internal write strobe signal may also be delayed by controller 120 to create an external strobe on strobe line 140. This ensures that data is written to DRAM 110 when it is considered valid.

Figure 1B:
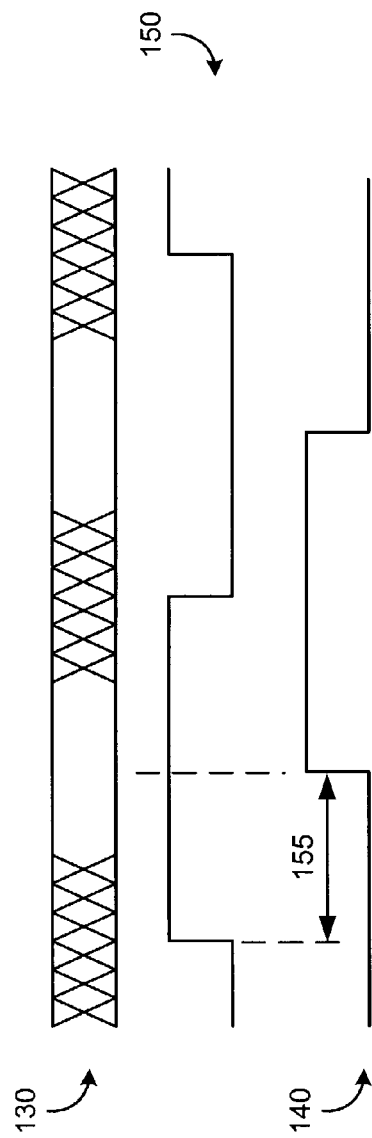
FIG. 1B is a timing diagram associated with the data line and the strobe line in FIG. 1A during a data write operation.

FIG. 1B is a timing diagram associated with data line 130 and strobe line 140 during a data write operation to DRAM 110. The "XXX" areas in the data signal on data line 130 may represent data transitions and associated periods of data instability in the data to be written by controller 120. The other "clear" areas in the data signal on data line 130 may represent time when the data is stable and considered valid. With reference to the above discussion, controller 120 may generate an internal write strobe signal 150 for the write operation whose transitions correspond to the transitions of the data signal to be written on data line 130.

Controller 120 may delay this internal write strobe signal 150 by a delay amount 155 to generate the external strobe on strobe line 140. Delay amount 155 may cause the transitions of the external strobe on strobe line 140 to fall near the center of the time when the data to be written on data line 130 is valid. Having these external strobe transitions on strobe line 140 fall near the center of the valid data time on data line 130 provides the most "operating margin" for controller 120 and DRAM 110. Controller 120 may produce a "symmetric" internal write strobe signal 150 and corresponding data on data line 130 (i.e., the duty cycle of internal write strobe signal 150 is about 50%). Hence, a single delay amount 155 may suffice to delay both rising and falling edges of internal write strobe signal 150 to cause both rising and falling edges of the external strobe on strobe line 140 to fall near the center of the valid data time on data line 130.

FIG. 1C is a timing diagram associated with data line 130 and strobe line 140 during a data read operation from DRAM 110. DRAM 110 may generate an external strobe signal on strobe line 140 for a read operation with rising and falling edges that correspond to transitioning of the data signals on data line 130. Controller 120 may delay this external strobe on strobe line 140 by a first delay amount 165 to create an internal positive read strobe 160. Controller 120 also may delay the external strobe on strobe line 140 by a second delay amount 175 to create an internal negative read strobe 170.

Unlike the write operation described above, the optimal strobe delays rising and falling edges of the external strobe on strobe line 140 may not be symmetrical. That is, DRAM 130 may not provide data signals on data line 130 equally long, and the corresponding external strobe signal on strobe line 140 from DRAM 130 may not have a 50% duty cycle. For this reason, controller 120 may delay a rising edge of the strobe signal on strobe line 140 by the first delay amount 165, and may delay a falling edge of the strobe signal on strobe line 140 by the second, different delay amount 175. In this manner, the rising edge of the internal positive read strobe 160 and the falling edge of the internal negative read strobe 170 may both be centered on the times when the data to be written on data line 130 is valid, despite the data on data line 130 (and the corresponding external strobe signal) being asymmetric. Having two different delays 165 and 175 of the external strobe signal may provide the most "operating margin" for controller 120 and DRAM 110 during a data read operation.

The amounts of delay from controller 120 for read and write operations (e.g., delays 155, 165, and 175) are typically known (e.g., based on the frequency at which DRAM 110 operates). Ensuring that these different delays in controller 120 remain accurate and relatively constant in the face of varying operating conditions (e.g., voltage, temperature, and fabrication process variations) allows the most "margin" to run controller 120 and DRAM 110 at high frequencies.

Figure 2:
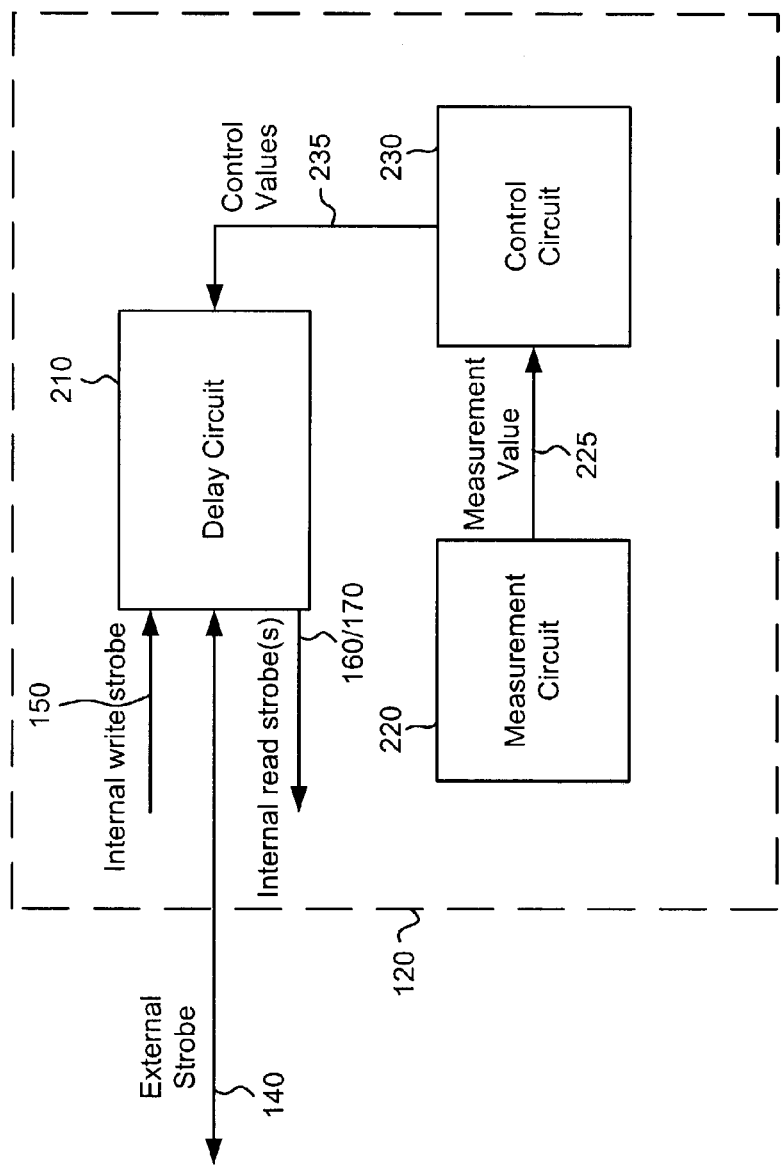
FIG. 2 is an exemplary memory controller in the system of FIG. 1A according to an implementation consistent with the principles of invention.

FIG. 2 is an exemplary implementation of memory controller 120. Controller 120 may include a delay circuit 210, a measurement circuit 220, and a control circuit 230 connected between delay circuit 210 and measurement circuit 220. Delay circuit 210 may be connected to bi-directional strobe line 140. Delay circuit 210 also may receive internal write strobe 150 and may produce internal read strobe(s) 160/170. Measurement circuit 220 may produce one or more measurement values 225, which are used by control circuit 230 to generate one or more control values 235. Control value(s) 235 may be used to adjust or control the amount of delay introduced by delay circuit 210.

Figure 3:
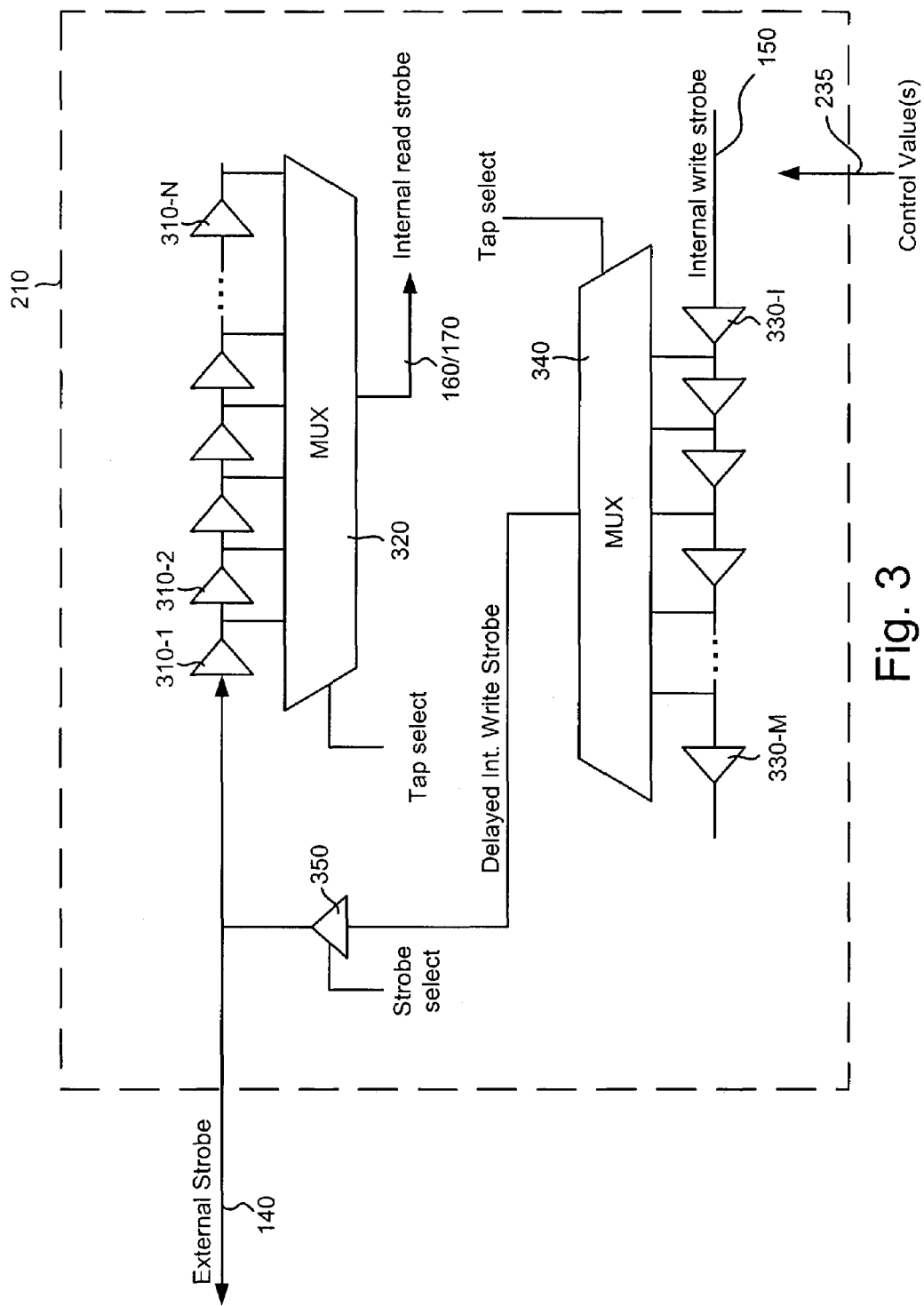
FIG. 3 is an exemplary delay circuit in the memory controller of FIG. 2 according to an implementation consistent with the principles of invention.

FIG. 3 is an exemplary implementation of delay circuit 210 in memory controller 120. Delay circuit 210 may include a number (N) of delay elements 310-1 . . . 310-N (collectively "delay line 310"), a multiplexer (MUX) 320, a (possibly different) number (M) of delay elements 330-1 . . . 330-M (collectively "delay line 330"), a MUX 340, and a selection element 350. Delay line 310 and MUX 320 may substantially constitute one selectable delay circuit to delay an external strobe signal from DRAM 110, and delay line 330 and MUX 340 may substantially constitute another selectable delay circuit to delay an internally-generated write strobe signal within controller 120. As discussed above, it may be desirable to generate two internal read strobe signals 160 and 170. In such a case, another selectable delay circuit (not shown) may be present in controller 120 and associated with strobe line 140 for data read operations.

Delay line 310 in the first selectable delay circuit may include buffer and/or inverter digital logic elements connected in series. Inputs to MUX 320 may "tap" into delay line 310 at certain points between adjacent delay elements (e.g., 310-1 and 310-2). As will be understood by those skilled in the art, the inputs to MUX 320 provide different delays of the signal input to delay line 310. One of these different delayed signals may be selected and output by MUX 320 via a tap select value.

Tap select value may designate a tap location along delay line 310, and this location (i.e., delay value) may be programmable. For example, a predetermined tap select value may be programmed and stored in a memory element (e.g., a register, not shown) within controller 120. In some implementations consistent with the principles of the invention, the tap select value may be modified (or even supplied) by control value(s) 235. For example, a nominal tap select value for delay line 310 may be stored, and this nominal value may be adjusted up or down by an offset in control value(s) 235. The resultant tap select value may be used to select which of MUX 320's inputs is used for the output of the delayed external strobe signal.

Those skilled in the art will understand how to control reading data from DDR DRAM 110 using the delayed strobe signal from MUX 320. Similarly, those skilled in the art will understand how to generate the internal write strobe that is input to delay line 330. Delay line 330 and MUX 340 function in the same manner as delay line 310 and MUX 320, so further description will be omitted. The tap select value for MUX 340 may also incorporate control value(s) 235 to select an appropriate tap in delay line 330. It should be noted, however, that MUX 340 may have a separately programmable and stored nominal tap select value than MUX 320. In this manner, controller 120 may provide two or more separately programmable delays that may be determined at least partially by control value(s) 235.

Figure 4:
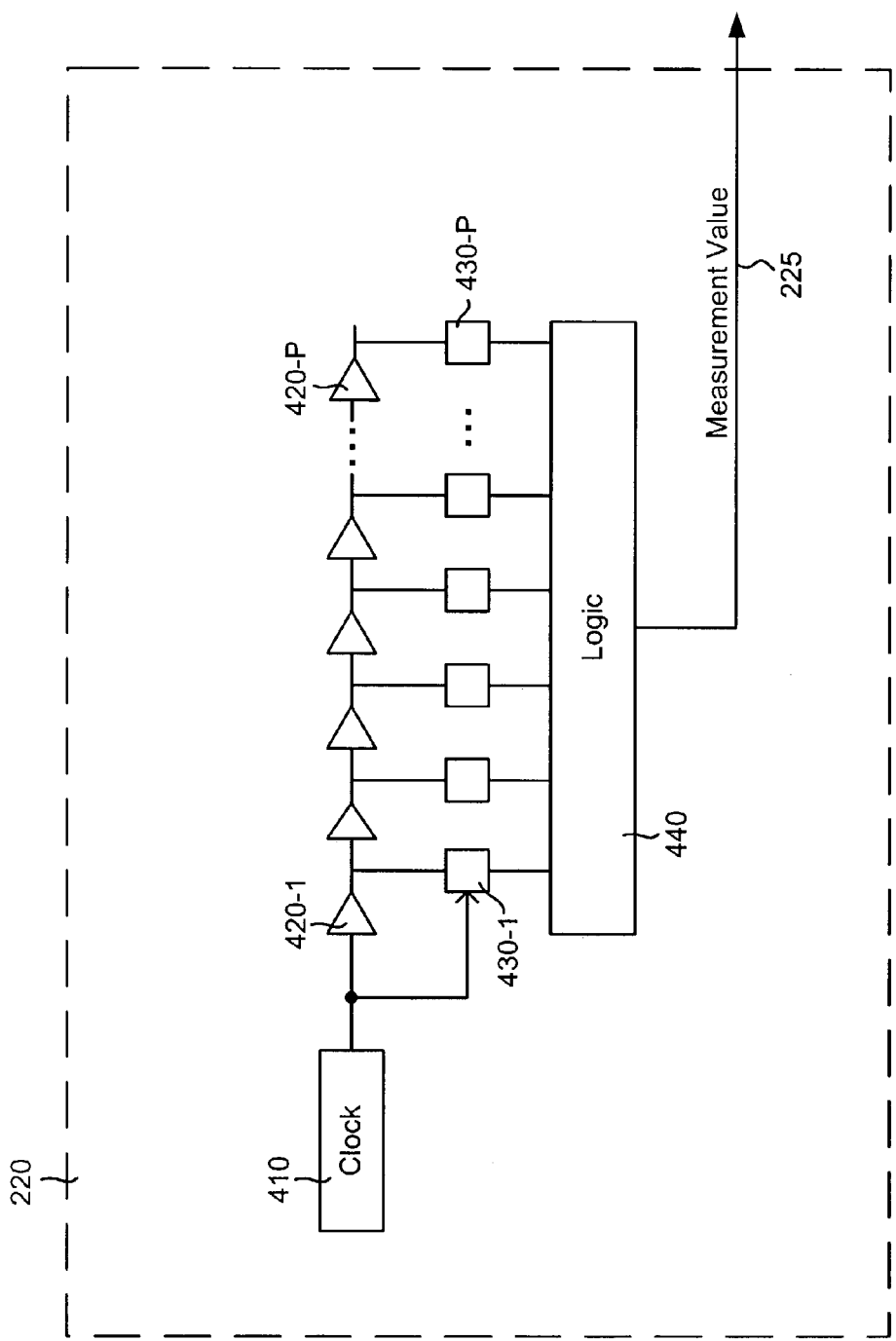
FIG. 4 is an exemplary measurement circuit in the memory controller of FIG. 2 according to an implementation consistent with the principles of invention.

FIG. 4 is an exemplary implementation of measurement circuit 220 of FIG. 2 in memory controller 120. Measurement circuit 220 may include a clock circuit 410, a number (P) of delay elements 420-1 ... 420-P (collectively "delay line 420"), a number (P) of storage elements 430-1 ... 430-P (collectively "storage elements 430"), and logic 440.

Clock circuit 410 may include any type of oscillator or logic that produces a toggling signal (e.g., a square wave). Clock circuit 410 may produce the toggling signal at a predetermined, possibly programmable, frequency.

Delay line 420 may include buffer and/or inverter digital logic elements connected in series. In one implementation, delay line 420 may include the same type of delay elements as delay lines 310/330. Delay line 420 may produce a successively delayed version of the input toggling signal after each delay element 420-1, 420-2, ... 420-P. In one implementation consistent with the principles of the invention, there are sufficient delay elements to delay the toggling signal by at least one period at element 420-P over all desired operating conditions.

It should be noted that the delays produced by delay line 420 may directly depend on the operating conditions of delay line 420. For example, voltage variations and/or temperature variations in ASIC including controller 120 (which in turn includes measurement circuit 220) may cause the delay produced by delay line 420 to be shorter or longer than its nominal/usual delay value. As such, the delay produced by delay line 420 in measurement circuit 220 may be viewed as a "proxy" or substitute for a direct measurement of the variations in the delays produced by delay lines 310/330 in delay circuit 210. In other words, the relative "speed" of delay lines 310/330 in delay circuit 210 (i.e., running "fast" or running "slow" relative to usual/nominal/ designed operating parameters) may be reflected in the measured delay variations of delay line 420 in measurement circuit 220.

Storage elements 430 may be arranged to tap into delay line 420 at successively delayed locations. Storage elements 430 may include, for example, flip-flops that are clocked by the toggling signal from clock circuit 410. Because delay line 420 delays the toggling signal from clock circuit 410 by about one period along its length and because the toggling signal clocks storage elements 430 once per period, storage elements 430 may output a sampled and delayed version of the toggling signal in which the delay varies up to one period. For example, when clocked under normal operating conditions, about half of storage elements 430 would output a zero and about half would output a one. The transition between contiguous zeros and contiguous ones may be expected to occur, for example, around storage element 430-(P/2).

Logic 440 may be configured to detect the location of the transition in the values from storage elements 430 and to output this position as measurement value 225. Logic 440 may include a location-of-first-change detector, which those skilled in the art will appreciate how to construct using logical elements. As one example, if there are 32 storage elements 430, logic 440 may be configured to output a value between 0 and 31 as measurement value 225. Depending on the operating conditions of controller 120 and the manufacturing process used for delay line 420, measurement value 225 may vary above or below its nominal value, respectively indicating a "fast chip" or a "slow chip." Further, the amount of variation from the nominal value (e.g., mid-scale: 15) provides a measure of how fast or slow delay circuit 210 is running.

Those skilled in the art will understand that some design flexibility exists in measurement circuit 220. For example, the frequency of clock circuit 410 and the number of delay elements in delay line 420 may be adjusted to produce a sufficient number (e.g., 16, 32, 64, etc.) of possible measurement values. Further, those skilled in the art will recognize in view of this explanation that the particular arrangement of elements in FIG. 4 is purely for ease of explanation. For example, there may be more delay elements in delay line 420 than there are storage elements 430 in some implementations.

Figure 5:
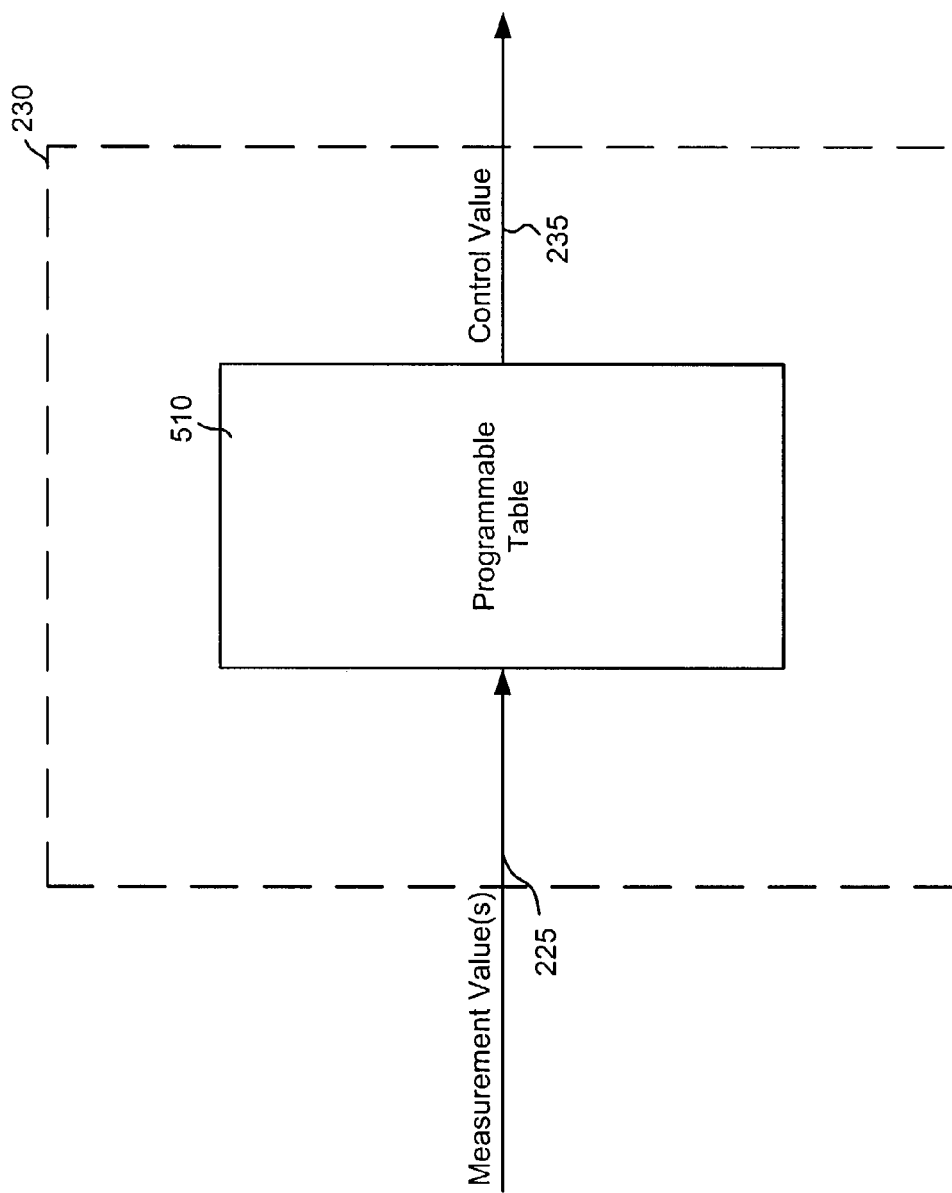
FIG. 5 an exemplary control circuit in the memory controller of FIG. 2 according to an implementation consistent with the principles of invention.

FIG. 5 an exemplary implementation of control circuit 230 of FIG. 2 in memory controller 120. Control circuit 230 may include a programmable table 510 that may be indexed by measurement value 225 and may output control value 235. In one implementation consistent with the principles of the invention, the control values stored in table 510 may be offsets to nominal tap select values stored in delay circuit 210. The offsets may vary from zero for a nominal measurement value 225 to ±7 or so for outlying measurement values (although more adjustment steps than ±7 may be used if warranted). By employing a nominal tap select value and offset scheme, individual differences in board layout geometry may be taken into account for individual delay lines (e.g., 310 and 330). A single offset value, however, may represent the operating conditions for multiple different delay lines.

In an alternative implementation, control values stored in table 510 may be the actual tap select values for delay circuit 210. In this manner, table 510 may accomplish any desired mapping between measurement value 225 and control value 235. Further, because table 510 is programmable, such mapping may be experimentally determined and set on a system-by-system basis, or on a production-run-by-production-run basis.

Exemplary Specific Implementation

Although FIG. 1A shows system 100 including one DRAM device 110 and one associated memory controller 120, and although FIG. 2 includes one delay circuit 210, one measurement circuit 220, and one control circuit 230, other numbers of and arrangements of these components are possible.

Figure 6:
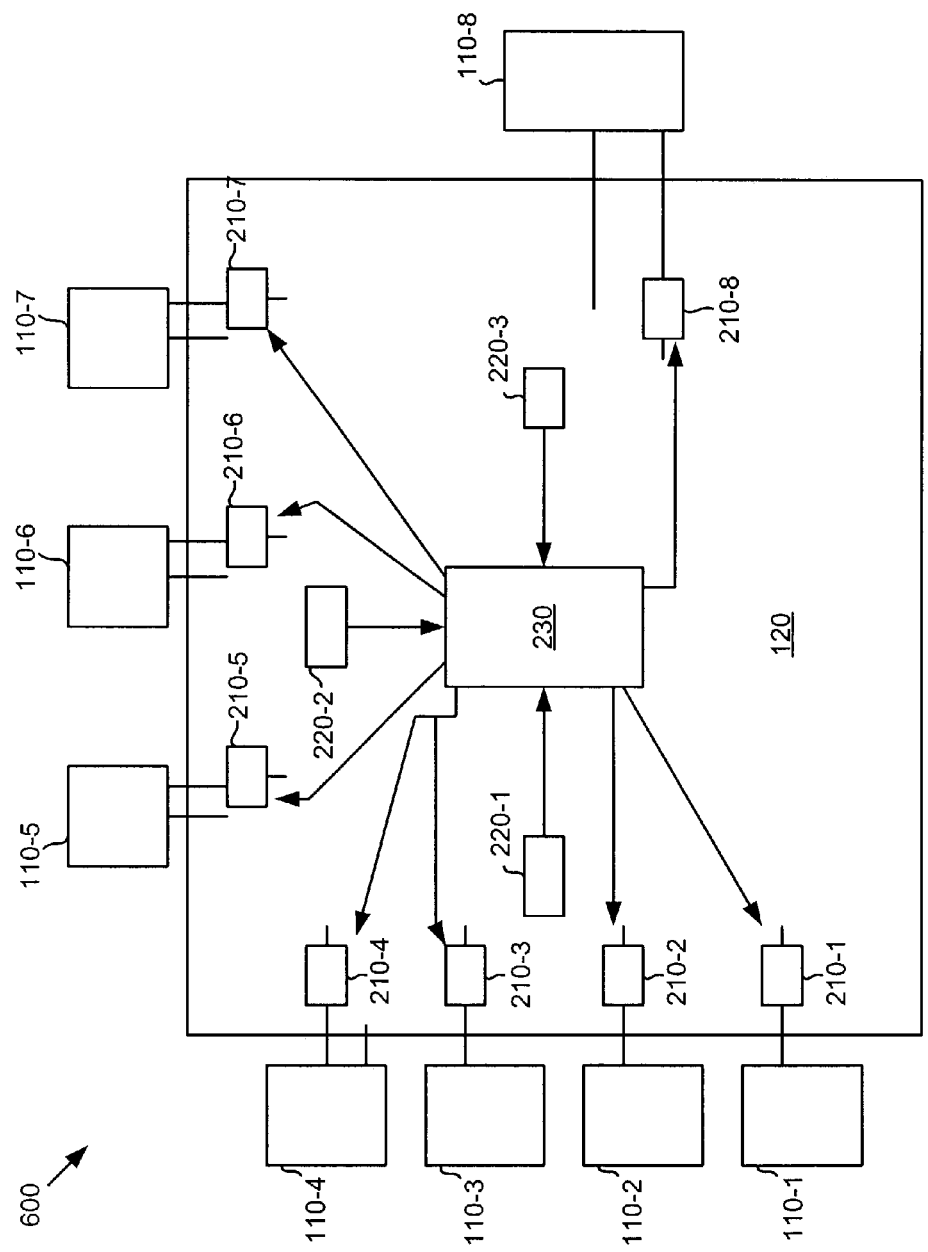
FIG. 6 is a diagram illustrating another exemplary system in which concepts consistent with aspects of the invention may be implemented.

FIG. 6 is a diagram illustrating another exemplary system 600 in which concepts consistent with aspects of the invention may be implemented. System 600 may include, for example, one controller 120 for eight DDR DRAM devices 110-1 to 110-8. Controller 120 may include eight delay circuits 210-1 to 201-8, three measurement circuits 220-1 to 220-3, and one control circuit 230. The elements in FIG. 6 operate substantially the same as their previously-described counterparts, and will not be further elaborated upon.

As mentioned previously, each of the eight delay circuits 210-1 to 201-8 may include up to three different selectable delay circuits (e.g., delay lines). Further, as illustrated in FIG. 6, measurement circuit 220-1 is located physically close to delay circuits 210-1 to 201-4. Similarly, measurement circuit 220-2 is located physically close to delay circuits 210-5 to 201-7, and measurement circuit 220-3 is located physically close to delay circuit 201-8. By such an arrangement, measurement circuits 220-1 to 220-3 may more accurately sense the local operating conditions to "their" group of delay circuits 210-1 to 210-8. Measurement circuits 220-1 to 220-3 may use the same tap select offsets from a single control circuit 230 in the implementation shown in FIG. 6.

Of course, the particular design of system 600 in FIG. 6 may be varied. One may use as many as one measurement circuit 220-x per delay line in delay circuits 210-x. Also, one may use as many as one control circuit 230-x per measurement circuit 220. Those skilled in the art will be able to make trade-offs between performance and hardware costs, in view of this disclosure, when designing systems similar to system 600 for controlling multiple DRAM devices 110-x.

Exemplary Adjustment and/or Control Processing

Figure 7:
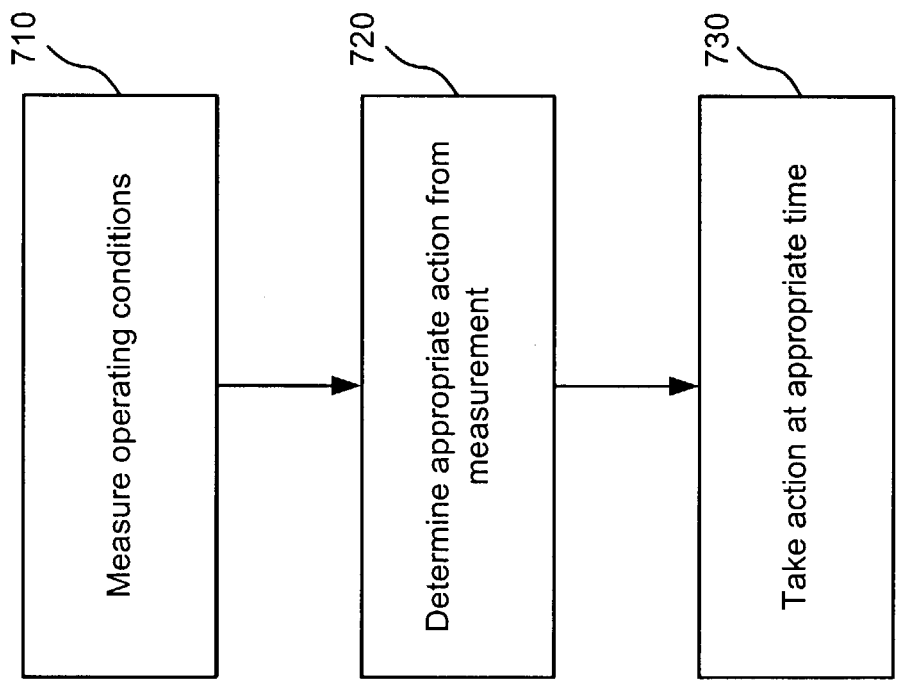
FIG. 7 illustrates an exemplary adjustment and/or control process consistent with the principles of the invention.

FIG. 7 illustrates an exemplary adjustment and/or control process consistent with the principles of the invention. The process may begin by measuring operating parameters [act 710]. This measurement act may include an indirect measurement of operating parameters using a proxy signal (e.g., from clock circuit 410, delay line 420, and storage elements 430) instead of a direct measurement of the operating parameters.

The process may continue by determining an appropriate action to take based on the measurement [act 720]. The action taken may be programmable, so that prior knowledge of system design parameters, such as board design, vendor memory specifications, nominal frequency, etc. is not needed. In one implementation, this determination may be made by a mapping of the measurement output to another "control value" (e.g., via programmable table 510). In one implementation consistent with the principles of the invention, this control value may include an offset for a delay line tap location. Other values are possible in the context of controlling a delay, such as the control value including the actual delay line tap location.

The process may conclude by taking appropriate action at the appropriate time based on the appropriate action in act 720 [act 730]. In one implementation consistent with the principles of the invention, this appropriate action may include instructing a MUX (e.g., 320/340) to change tap locations on a respective delay line 310/330. Changing tap locations also should be performed at an appropriate time (i.e., when the strobe signal is not running) to avoid a glitch on strobe line 140. One choice for such a time is during a DRAM refresh cycle. Other choices are possible, such as changing the tap on the read delay line (e.g., 310) during a write operation and changing the tap on the write delay line (e.g., 330) during a read operation.

Exemplary Generalized System

As alluded to in the above description of FIG. 7, the principles of the invention are not limited to delaying strobe signals in conjunction with DRAM access. Rather, the principles of the invention are applicable to adjusting any delay signals, and more generally, to adjusting any system parameter based on a proxy measurement of operating conditions.

Figure 8:
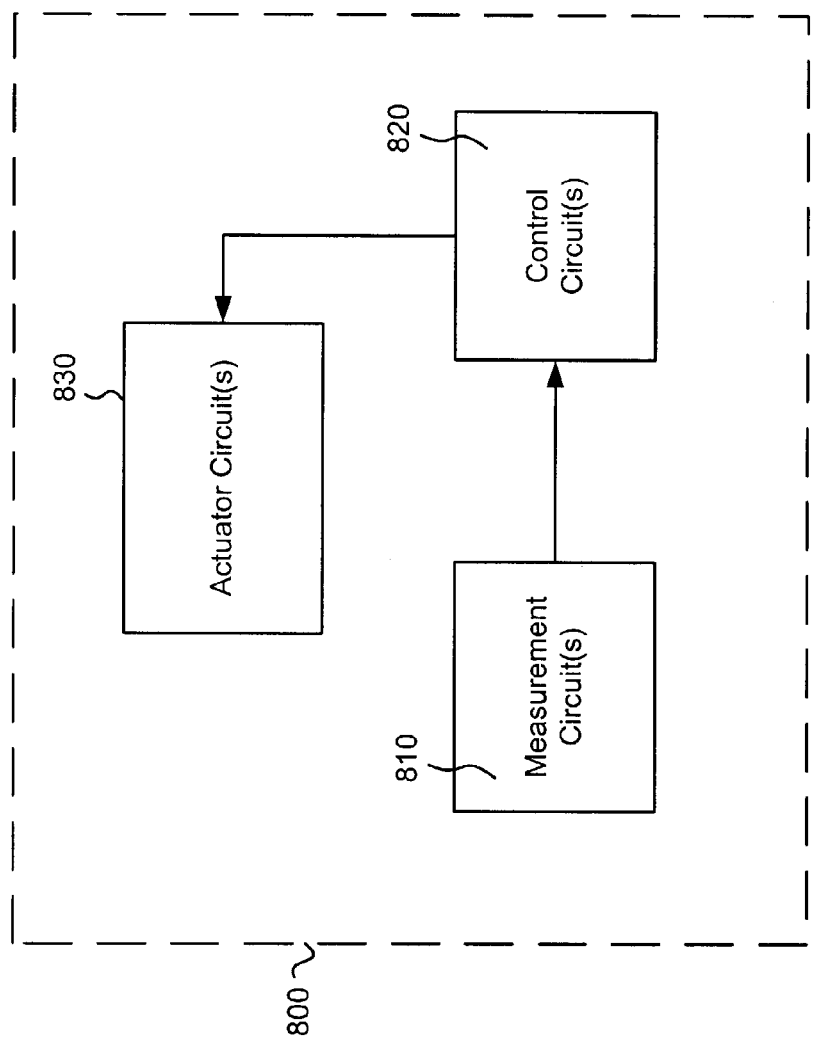
FIG. 8 is a diagram illustrating a generalized system consistent with the principles of the invention.

FIG. 8 is a diagram illustrating a generalized system 800 consistent with the principles of the invention. System 800 may include one or more measurement circuits 810, one or more control circuits 820, and one or more actuator circuits 830. Measurement circuit(s) 810 may be configured as the previously-described measurement circuit 220 (FIG. 4), which generates a measurement value based on variations in a proxy (toggling) signal.

Control circuit(s) 820 may be configured as the previously-described measurement circuit 230 (FIG. 5), which generates a control value based on an input measurement value. Like measurement circuit 230, control circuit(s) 820 may be programmable to allow a control value mapping to be set, for example, uniformly at the time of manufacture or on a per-unit basis when systems 800 are deployed in the field.

Actuator circuit(s) 830, rather than being limited to delay circuit 210, may be any actuator capable of changing a system parameter that is susceptible to indirect measurement by measurement circuit(s) 810. For example, actuator circuit 830 may be a timing circuit to control the master clock frequency of system 800. Alternately, actuator circuit 830 may be a heater circuit to control the temperature of system 800. Alternately, actuator circuit 830 may be a voltage adjustment circuit to control one or more power supply voltages of system 800. In another implementation, actuator 830 may control some combination of frequency, temperature, voltage, or another directly controllable system parameter to adjust any another system parameter that varies based on the frequency, voltage, temperature, or other parameter.

CONCLUSION

Consistent with the principles of the present invention, a memory controller may generate asymmetric delays based on operating conditions of the controller and pre-programmed, nominal delay values. A correspondence between the operating conditions and the an amount of delay adjustment may also be programmed into and stored in the controller.

The foregoing description of embodiments of the present invention provides illustration and description, but is not intended to be exhaustive or to limit the invention to the precise form disclosed. Modifications and variations are possible in light of the above teachings or may be acquired from practice of the invention.

While a series of acts has been described in FIG. 5, the order of the acts may vary in other implementations consistent with the present invention. Also, non-dependent acts may be performed in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A system, comprising:
    a memory configured to generate a timing signal;
    a delay circuit configured to delay a first portion of the timing signal by a first amount based on a control signal and delay a second portion of the timing signal by a second amount that is different than the first amount based on the control signal;
    a measurement circuit configured to measure one or more parameters of the system and generate a measurement value; and
    a control circuit configured to convert the measurement value into the control signal for the delay circuit.

2. The system of claim 1, wherein the memory is a random access memory (RAM) device.

3. The system of claim 1, wherein the delay circuit includes:
    a first delay line configured to delay the first portion of the timing signal by the first amount, the first amount being determined by the control signal, and
    a second delay line configured to delay the second portion of the timing signal by the second amount, the second amount being determined by the control signal.

4. The system of claim 1, wherein the measurement circuit includes:
    a clock circuit configured to generate a toggle signal, and
    a measurement portion triggered by the toggle signal to measure a delay amount and generate the measurement value.

5. The system of claim 4, wherein the measurement value is proportional to a change in the delay amount.

6. The system of claim 1, wherein the control circuit includes:
    a table that is indexed by the measurement value to produce the control signal.

7. The system of claim 6, wherein the measurement value is proportional to an amount of delay within the measurement circuit.

8. The system of claim 6, wherein values in the table are programmable.

9. A controller, comprising:
    a measurement circuit configured to generate a proxy signal representing delay variations in the controller and generate a measurement value from the proxy signal;
    a control circuit configured to convert the measurement value into a control value where the control circuit includes:
        a memory device configured to map the measurement value to the control value based on a magnitude of the measurement value; and
    a delay circuit that is adjustable by the control value to alter an amount of delay of a signal.

10. The controller of claim 9, wherein the measurement circuit includes:
    a clock circuit configured to generate a toggling signal, and
    a delay line configured to delay the toggling signal.

11. The controller of claim 10, wherein the measurement circuit further includes:
    a plurality of storage devices configured to sample the delayed toggling signal at a plurality of points along the delay line, and
    logic configured to convert values from the plurality of storage devices into the measurement value.

12. The controller of claim 9, wherein the memory is programmable to store different mappings of measurement values to control values.

13. The controller of claim 9, wherein the delay circuit includes:
    a delay line including a plurality of delay elements configured to delay the signal.

14. The controller of claim 13, wherein the delay circuit further includes:
    a multiplexer whose inputs tap the delay line between adjacent delay elements and which selects one input tap of the delay line to pass to an output based on the control value.

15. The controller of claim 14, wherein the multiplexer has an associated nominal tap value, and
    wherein the control value represents an offset to be applied to that nominal tap value to alter the amount of delay of the signal.

16. A method of controlling an actuator circuit in a system, comprising:
    measuring an operating condition of the system using a proxy that is proportional to the operating condition;
    determining an adjustment value from the measured operating condition by programming a mapping between a plurality of measured operating conditions and a plurality of adjustment values; and
    controlling the actuator circuit based on the adjustment value.

17. The method of claim 16, wherein the controlling includes:
    varying an amount of delay in a variable delay line based on the adjustment value.

18. The method of claim 16, wherein the controlling includes:
    changing the operating condition based on the adjustment value.

19. The method of claim 18, wherein the changing includes:
    adjusting a clock frequency, a voltage, or a temperature with the actuator circuit based on the adjustment value.

* * * * *